(12) United States Patent
Nakamura et al.

(10) Patent No.: US 8,981,790 B2
(45) Date of Patent: Mar. 17, 2015

(54) ELECTRONIC DEVICE AND NOISE CURRENT MEASURING METHOD

(75) Inventors: Satoshi Nakamura, Yokohama (JP); Takashi Suga, Yokohama (JP); Yutaka Uematsu, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 739 days.

(21) Appl. No.: 13/375,742

(22) PCT Filed: May 26, 2010

(86) PCT No.: PCT/JP2010/003518
§ 371 (c)(1),
(2), (4) Date: Jan. 11, 2012

(87) PCT Pub. No.: WO2010/140318
PCT Pub. Date: Dec. 9, 2010

(65) Prior Publication Data
US 2012/0119757 A1    May 17, 2012

(30) Foreign Application Priority Data
Jun. 3, 2009    (JP) ................................ 2009-134139

(51) Int. Cl.
*G01R 29/26*    (2006.01)
*G01R 31/08*    (2006.01)
(Continued)

(52) U.S. Cl.
CPC .............. *G01R 31/001* (2013.01); *G01R 29/26* (2013.01); *G01R 31/281* (2013.01);
(Continued)

(58) Field of Classification Search
CPC .... G01R 29/26; G01R 31/001; G01R 31/281; H05K 1/0234

USPC ................................................... 324/613, 522
See application file for complete search history.

(56) References Cited

U.S. PATENT DOCUMENTS

2003/0186569 A1    10/2003    Suzuki et al.
2007/0207636 A1    9/2007    Funato et al.
(Continued)

FOREIGN PATENT DOCUMENTS

JP    5-243776 A    9/1993
JP    9-23083 A    1/1997
(Continued)

OTHER PUBLICATIONS

International Search Report with English translation dated Jun. 22, 2010 (two (2) pages).

*Primary Examiner* — Amy He
(74) *Attorney, Agent, or Firm* — Crowell & Moring LLP

(57) ABSTRACT

A noise current passing through a substrate on which an electronic component is mounted is suppressed in a housing, to provide a malfunction of an electronic device. A substrate (103) on which an electronic component is mounted is secured to a housing (102) by a metal spacer (108) and a screw (104). A noise control member (100) mainly composed of an insulation substance is disposed between the metal spacer (108) and the substrate (103). A first conductive film is formed on the metal spacer-side of the noise control member (100), and a second conductive film is formed on the substrate-side of the noise control member (100). A resistance member (101) is disposed between the first conductive film and the second conductive film. A noise current introduced from the housing to the substrate can be suppressed by the resistance member.

9 Claims, 16 Drawing Sheets

(51) Int. Cl.
*G01R 31/00* (2006.01)
*G01R 31/28* (2006.01)
*H05K 9/00* (2006.01)
*H05K 1/02* (2006.01)
*H05K 1/14* (2006.01)
*H05K 3/32* (2006.01)

(52) U.S. Cl.
CPC ........... *H05K 1/0215* (2013.01); *H05K 1/0234* (2013.01); *H05K 1/141* (2013.01); *H05K 3/325* (2013.01); *H05K 9/0039* (2013.01); *H05K 9/0069* (2013.01); *H05K 2201/10022* (2013.01); *H05K 2201/10409* (2013.01); *H05K 2201/2036* (2013.01)
USPC .......................................... 324/613; 324/522

(56) References Cited

U.S. PATENT DOCUMENTS

| | | |
|---|---|---|
| 2008/0074857 A1 | 3/2008 | Funato et al. |
| 2010/0253367 A1 | 10/2010 | Funato et al. |

FOREIGN PATENT DOCUMENTS

| | | |
|---|---|---|
| JP | 10-163665 A | 6/1998 |
| JP | 2001-76931 A | 3/2001 |
| JP | 2001-76932 A | 3/2001 |
| JP | 2001-267134 A | 9/2001 |
| JP | 2003-298204 A | 10/2003 |
| JP | 2007-85741 A | 4/2007 |
| JP | 2007-240162 A | 9/2007 |
| JP | 2008-60435 A | 3/2008 |
| JP | 2008-172280 A | 7/2008 |
| JP | 2010-283069 A | 12/2010 |

ELECTRONIC DEVICE AND NOISE CURRENT MEASURING METHOD

TECHNICAL FIELD

The present invention relates to an electronic device that is configured to prevent an electronic component disposed on a PCB (Printed Circuit Board) or PWB (Printed Wiring Board) inside an enclosure from breakdown or malfunction due to noise such as static electricity. The invention also relates to a method of measuring a noise current caused by static electricity or the like applied to the electronic device.

BACKGROUND ART

Electronic devices such as consumer devices, manufacturing devices, and inspecting devices are specified to undergo an immunity tolerance test (IEC61000-4-2). The immunity test aims to confirm that the electronic device will not malfunction even if it is subjected to electrostatic discharge caused by people touching a portion of the electronic device or aerial discharge. Recently, immunity tolerance of semiconductors has deteriorated since operating margin has been reduced for lower source voltage, and non-metalization of enclosures has been promoted for weight saving of electronic devices. Thus, the environment of the electronic device regarding static electricity is becoming severe from year to year. Countermeasure costs needed to pass the above-mentioned electrostatic test tend to increase as well. Further, malfunctions due to static electricity occur even in the devices that have passed the test, which is now a major problem.

In such situation, a demand for a technology to improve the immunity tolerance and electrostatic resistance characteristics of an electronic device is increasing. It is therefore urgent to develop a component, a PCB or PWB, and an enclosure structure which are adopted to control noise current flowing into a semiconductor (e.g. LSI) that is susceptible to static electricity and to construct designing technology for them. Further, establishing a technology for identifying current paths during the immunity tests or electrostatic tests and elucidating mechanisms where faults occur are important in order to construct the designing technology of the noise suppression component, the PCB or PWB and the enclosure structure.

A current that flows through a screw/spacer portion connecting an enclosure with a PCB or PWB in an electronic device is a key factor for solving immunity issues including static electricity. This is because, particularly in an electrostatic issue, the noise current caused by electrostatic discharge may flow from the enclosure via the screw/spacer to the PCB or PWB, and the noise current that has flown into the PCB or PWB may be released to the enclosure via the screw/spacer.

The current flowing through a screw/spacer portion is also an important factor regarding a problem related to EMI (Electromagnetic Interference) from an electronic device. The noise current generated in a semiconductor such as LSI flows from the PCB or PWB via the screw/spacer portion into the enclosure, thereby causing EMI.

The following technologies are proposed for these issues and problems. "Patent document 1", "patent document 2" and "patent document 3" describe a screw-like component having a transmission line structure composed of inductance and capacitance to hold low-pass filter characteristics.

In the electronic devices disclosed in "Patent document 4", "patent document 5", and "patent document 6", an enclosure and a PCB or PWB is secured by a metal spacer and the surrounding of the spacer is covered with a magnetic core, thus forming an integrated spacer. "Patent document 4" further describes a technology for inserting a washer-like resistance sheet between a spacer and an enclosure.

On the other hand, in order to identify the cause of EMI from the overall electronic device, "patent document 6" discloses a technology for measuring an electric current flowing through a screw portion connecting the enclosure and PCB or PWB of an electronic device. This relates to a current probe having a coil for detecting magnetic flux caused by the current flowing through the screw portion between the enclosure and PCB or PWB and to a measuring method using the current probe.

PRIOR-ART DOCUMENTS

Patent Documents

Patent document 1: JP-2001-267134
Patent document 2: JP-2001-76931
Patent document 3: JP-2001-76932
Patent document 4: JP-A-H09-23083
Patent document 5: JP-A-H10-163665
Patent document 6: JP-A-2007-85741

SUMMARY OF THE INVENTION

Problem to be Solved by the Invention

"Patent document 1", "patent document 2" and "patent document 3" describe a low-pass filter structure in which the inductance and parasitic capacitance of a screw connecting an enclosure and a PCB or PWB are arranged with respect to an electric current in a distributed manner. However, the inductance and capacitance of the screw with a length of approximately 5 to 10 mm and an opening portion with a diameter of approximately 2 to 6 mm are very small. Thus, cut-off frequency of the low-pass filter is predicted to approach GHz. The cut-off frequency band width may therefore be insufficient for a noise current having a wide band of several MHz to several GHz such as an electrostatic discharge current.

The documents also describe that the cut-off frequency may be several hundred MHz if the parasitic capacitance between the PCB or PWB and the enclosure are taken into account. However, this cut-off frequency is determined by the structure of the PCB or PWB and the enclosure and cannot be controlled purposefully. The cut-off frequency band width may be insufficient as well. Further, since a resistance component serving as a loss is not considered, the current may adversely increase when the inductance and the capacitance resonate.

In patent documents 4 and 5, the enclosure and the PCB or PWB are connected to each other by the metal spacer surrounded by the magnetic material, whereby the EMI due to cavity resonance in the enclosure is suppressed. In addition, a resistance sheet is inserted between the enclosure and the metal spacer, whereby a high-frequency current flowing through the screw is suppressed.

However, in the metal spacer surrounded by the magnetic material, the inductance component and the resistance component possessed by the magnetic material are not inserted in series with respect to the current flowing from the PCB or PWB to the enclosure. An electric current may partially flow through the metal spacer so that a targeted reduction effect is possibly not produced.

The resistance sheet inserted between the enclosure and the metal spacer does not have selectivity of a resistance value.

Noise currents with a wide band of several MHz to several GHz may therefore not be sufficiently suppressed. When the resistance sheet is inserted between the enclosure and the screw spacer, the selectivity of the resistance value is of importance since the cut-off frequency band width of noise is determined by the resistance of the resistance sheet and the inductance component possessed by the screw, the enclosure and the PCB or PWB.

On the other hand, patent document 6 proposes a method of measuring a current flowing through the joint portion between the PCB or PWB and the enclosure, by use of a probe with a coil for detecting flux caused by the current flowing through the screw portion. However, an end of the coil of the probe in patent document 6 also has sensitivity to factors such as an exogenous magnetic field. In particular, the intensity of the magnetic field emitted by an electrostatic gun used in an electrostatic test is significantly large. Therefore in the immunity test such as the electrostatic test, it is required that sensitivity to the exogenous magnetic field is suppressed while sensitivity to the current to be measured flowing in the screw portion is maintained.

Accordingly, an object of the present invention is to provide a noise suppression component in which a loss component can be inserted in series with respect to a wide band noise current such as an electrostatic discharge current flowing into a joint portion between a PCB or PWB and an enclosure, a screw or a spacer, and that can purposefully control a cut-off frequency band width. Another object of the present invention is to provide a component that can be replaced with a common component by use of a noise suppression component without increasing costs for countermeasures: the addition of a new component or the modification of a PCB or PWB wiring pattern or the like.

Another object of the present invention is to provide a current measuring probe that is less susceptible to an exogenous magnetic field emitted from a testing machine etc. during an immunity test and a measuring method using the current measuring probe.

Means for Solving the Problem (1) An electronic device in which an enclosure and a PCB or PWB with a circuit component mounted thereon are secured by a screw and a metal spacer: wherein a noise suppression component of which base material is an insulating material is disposed between the PCB or PWB and the metal spacer; and a first conducting portion is formed on the metal spacer side of the noise suppression component, a second conducting portion is formed on the PCB or PWB side of the noise suppression component, and a resistance member is disposed between the first conducting portion and the second conducting portion.

(2) The electronic device according to (1): wherein the resistance member is disposed on a first surface of the noise suppression component.

(3) The electronic device according to (1): wherein the resistance member is embedded in the inside of the noise suppression component.

(4) The electronic device according to (1): wherein a plurality of the resistance members are formed parallel to each other.

(5) An electronic device in which an enclosure and a PCB or PWB with a circuit component mounted thereon are secured by a screw having a plate portion and a shank portion and a metal spacer: wherein the plate portion of the screw includes a first conductive portion connected to the shank portion, an insulator portion surrounding the first conductive portion, and a second conductive portion surrounding the insulator portion and electrically connected to the PCB or PWB; and a resistance member is disposed between the first conductive portion and the second conductive portion.

(6) The electronic device according to (5): wherein the resistance member is disposed on a surface of the insulator portion.

(7) The electronic device according to (5): wherein the resistance member is embedded in the inside of the insulator portion.

(8) The electronic device according to (5): wherein a plurality of the resistance members are formed.

(9) A method of measuring a noise current in an electronic device: wherein the electronic device has a configuration such that an enclosure and a PCB or PWB with a circuit component mounted thereon are secured by a screw and a metal spacer; a noise suppression component of which base material is an insulating material is disposed between the PCB or PWB and the metal spacer; a first conducting portion is formed on the metal spacer-side of the noise suppression component, a second conducting portion is formed on the PCB or PWB-side of the noise suppression component and a resistance member is disposed between the first conducting portion and the second conducting portion; and voltage between two ends of the resistance member is measured via a matching resistor connected in series with the resistance member.

Effect of the Invention

According to the present invention, electrostatic resistance characteristics or like immunity tolerance of an electronic device such as an information processor, an information appliance, or a storage device can be improved to enhance reliability of the electronic device, without adding a countermeasure component to a printed PCB or PWB mounted on the electronic device. In addition, the present invention can suppress EMI from the electronic device.

MODE FOR CARRYING OUT THE INVENTION

Figure 1:
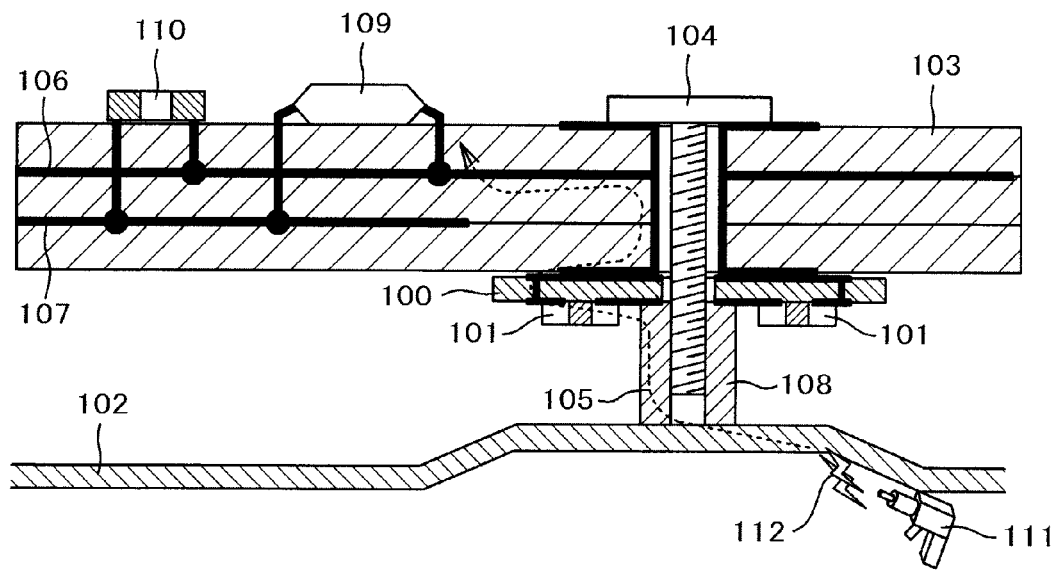
FIG. 1 is a cross-sectional view of a device on which a noise suppression component is mounted between a metal spacer and a PCB or PWB.

Embodiments are hereinafter described along with their effects in detail with reference to the drawings illustrating the present invention. Incidentally, elements having the same function are denoted with like reference numerals in all of the drawings for explaining the embodiments and their repeated explanations are omitted.

Embodiment 1

FIG. 1 is a cross-sectional view of a device on which an electrostatic noise suppression component is mounted, illustrating a typical embodiment of the present invention.

Figure 16:
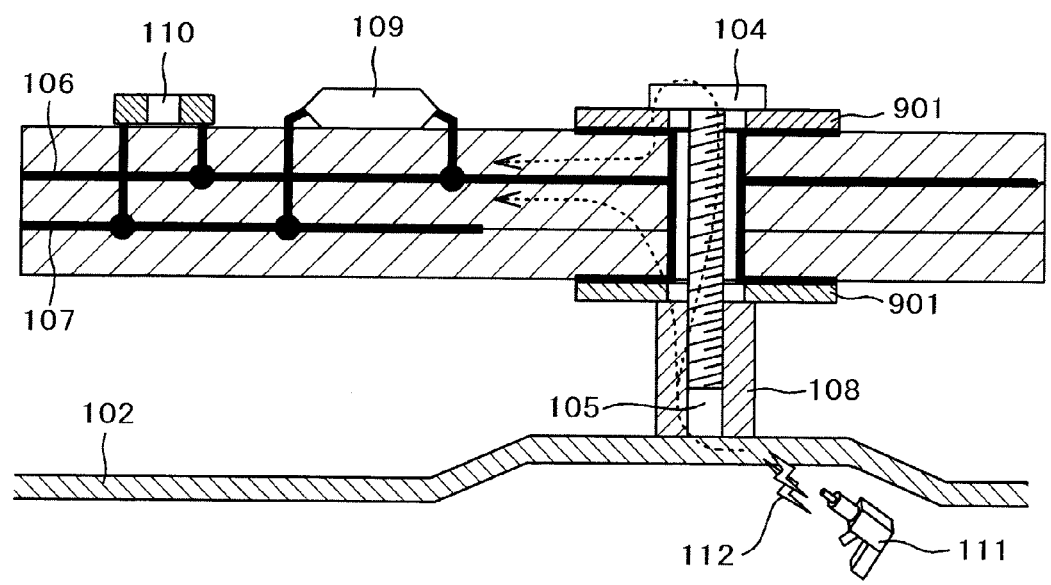
FIG. 16 is an image view of a metal enclosure and a PCB or PWB secured to each other in a conventional manner.

A problem in a conventional electrostatic test is described using FIG. 16 before the description of the embodiments of the present invention. FIG. 16 is a cross-sectional view of an electronic device in which a metal enclosure 102 and a PCB or PWB 103 are secured via a metal spacer 108 by means of a screw 104. The PCB or PWB 103 has a ground trace 106 and a power trace 107, and an LSI (Large Scale Integrated Circuit) 109 and a bypass capacitor 110 are mounted thereon.

As mentioned in "Background Art", in the electrostatic test specified in IEC61000-4-2, electrostatic noise 112 is applied to a portion of an electronic device where people touch, a metal enclosure in FIG. 16 for example, by use of an ESD (Electrostatic Discharge) gun 111. The noise current 105 occurring at this time flows from the metal enclosure 102 via the metal spacer 108 and a metal washer 901 or via the screw 104 and the metal washer 901 into the ground trace 106 of the PCB or PWB 103.

The noise current 105 flowing into the ground trace causes a voltage fluctuation in the ground trace 106. This causes malfunctions such as error reset of an active component (e.g. LSI 109) and unlocking of a transmitter. The noise current 105 flowing into the ground trace 106 induces noise voltage/current in the power trace 107, a signal line or the like due to capacitive/inductive coupling, thereby causing the malfunctions in the LSI 109 as above. These matters consequently lead to a failure of the overall electronic device system and degrade reliability.

Accordingly, to enhance the reliability of the overall electronic device system, the above-mentioned malfunctions of the LSI 109 due to the electrostatic noise 112 is required to be reduced. In order to achieve this, a countermeasure component such as a bypass capacitor 110 or the like is mounted on the PCB or PWB 103. Other examples of the countermeasure component include a varistor, an ESD protection diode and an EMI filter.

However, it is difficult to predict where (which line) the noise current 105 dominantly flows on the PCB or PWB 103 in the electrostatic test and the mechanism thereof is not understood. It is therefore very difficult to dispose the above-mentioned countermeasure component against the current path of the noise current 105 accurately and effectively. For such reason, PCBs or PWBs are designed in a manner that every portion possible to be problematic is mountable with the countermeasure component, which in turn increases the proportion of a countermeasure component cost to a PCB or PWB size and raises component costs and PCB or PWB costs.

A basic countermeasure such that prevents the noise current 105 from flowing into the LSI 109 on the PCB or PWB 103, the ground trace 106 and the power trace 107 is needed to avoid this. The present invention provides a component that controls the noise current 105 flowing from the metal enclosure 102 via the metal spacer 108 into the PCB or PWB 103.

A component embodying the present invention is next described in detail with reference to FIG. 1. As described earlier, electrostatic noise 112 is applied to a metal enclosure 102 in FIG. 1 by use of an ESD gun 111 in electrostatic tests. A noise current 105 then flows from the metal enclosure 102 via a metal spacer 108 or a screw 104 into a PCB or PWB 103.

In the present invention, a noise suppression component 100 is inserted between the metal spacer 108 and the PCB or PWB 103 as shown in FIG. 1. The noise suppression component 100 includes resistors 101 arranged on an insulating base material having wiring on the front surface thereof. Inserting the noise suppression component 100 allows the resistors 101, serving as loss components with respect to the pathways of the noise current 105 flowing from the metal enclosure 102 into the PCB or PWB 103, to be disposed purposefully.

As described, by inserting the loss component into the pathway of the noise current, the noise current 105 flowing into the PCB or PWB 103 can be reduced. Therefore it is not necessary to dispose the countermeasure components at all the positions possible to be problematic on the PCB or PWB 103 as described above. This suppresses an increase in PCB or PWB cost.

The noise suppression component 100 is inserted in place of the metal washer 901 in FIG. 16; therefore, a new component is not added. A new component such as the resistance sheet or the magnetic body inserted between the metal spacer 108 and the PCB or PWB 103 which are employed in the conventional art is not added. In addition, since an intended resistant value can be inserted, a reduction amount and a frequency band width intended to be reduced of the noise current 105 can be controlled easily.

Another embodiment different from the embodiment shown in FIG. 1 is described with reference to FIG. 2. In the embodiment shown in FIG. 2, the spacer connecting a metal enclosure 102 with a PCB or PWB is a metal-embedded plastic spacer 201 of which surface is of plastic and the inside is of metal. The metal inside the spacer is not in direct contact with the PCB or PWB 103.

Figure 2:
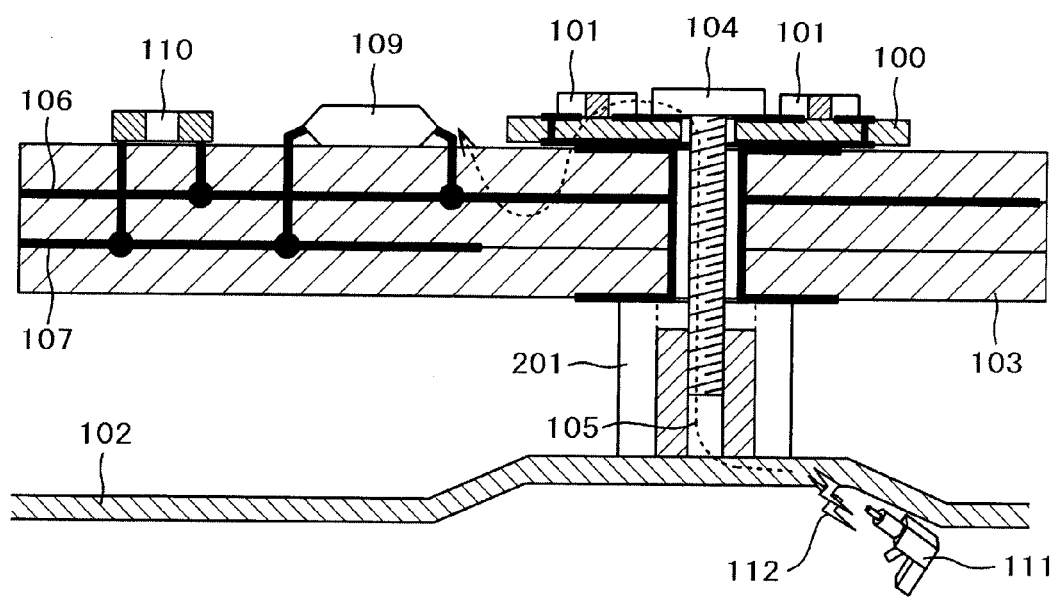
FIG. 2 is a cross-sectional view of the device on which the noise suppression component is mounted between a screw and the PCB or PWB.

In this case, when the electrostatic noise 112 is applied to the metal enclosure 102 by an ESD gun 111, the component of the noise current 105 which flows into the PCB or PWB 103 via the metal space 108 is very small in FIG. 2 unlike in FIG. 1. This is because the ground trace 106 of the PCB or PWB 103 and the enclosure 102 are not electrically connected to each other due to the presence of the metal-embedded plastic spacer. The current flowing from the enclosure 102 to the PCB or PWB 103 via the metal spacer and the screw can be thus controlled.

Figure 3:
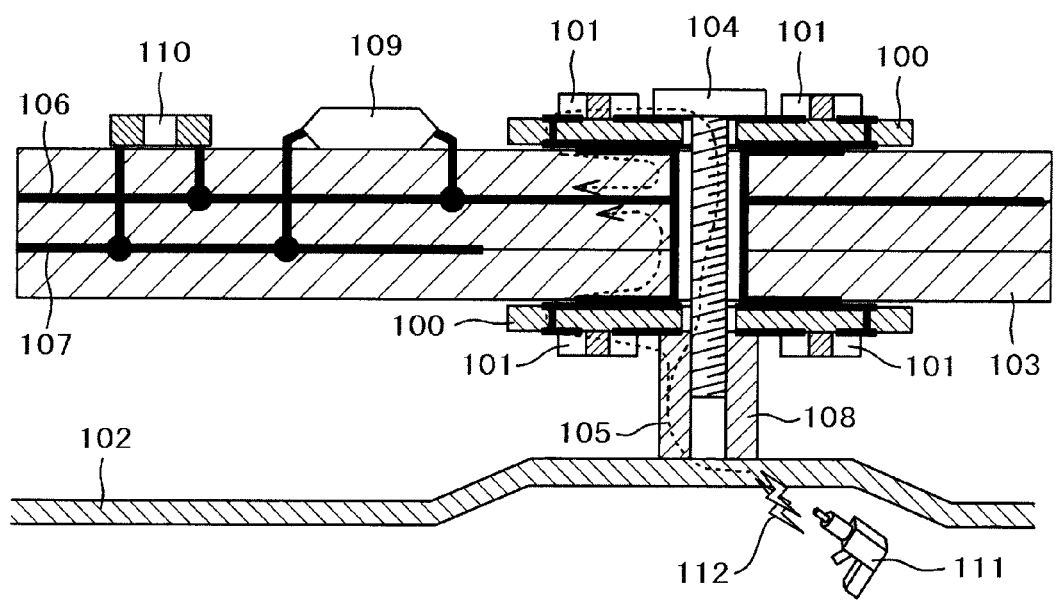
FIG. 3 is a cross-sectional view of the device on which the noise suppression component is mounted between the spacer and the PCB or PWB/screw.

FIG. 3 shows another embodiment of the present invention. In the embodiment of FIG. 3, the noise suppression component 100 is inserted between the metal spacer 108 and the PCB or PWB 103, and between the screw 104 and the PCB or PWB 103. With the arrangement of the noise suppression components 100 as shown in FIG. 3, both the noise current 105 flowing from the metal enclosure 102 to the PCB or PWB 103 via the metal spacer 108 and the noise current 105 flowing from the metal enclosure to the PCB or PWB 103 via the metal spacer 108 and via the screw 104 can be controlled. An effect of further reducing the noise current 105 can be achieved compared with that in the embodiment shown in FIG. 1.

In the description of embodiment 1 using FIGS. 1-3, only one of the portions connecting the metal enclosure 102 with the PCB or PWB 103 was described. However, if the noise suppression component 100 of the present invention is inserted into all of the portions connecting the metal enclosure 102 with the PCB or PWB 103, a further high effect can be obtained.

Figure 14:
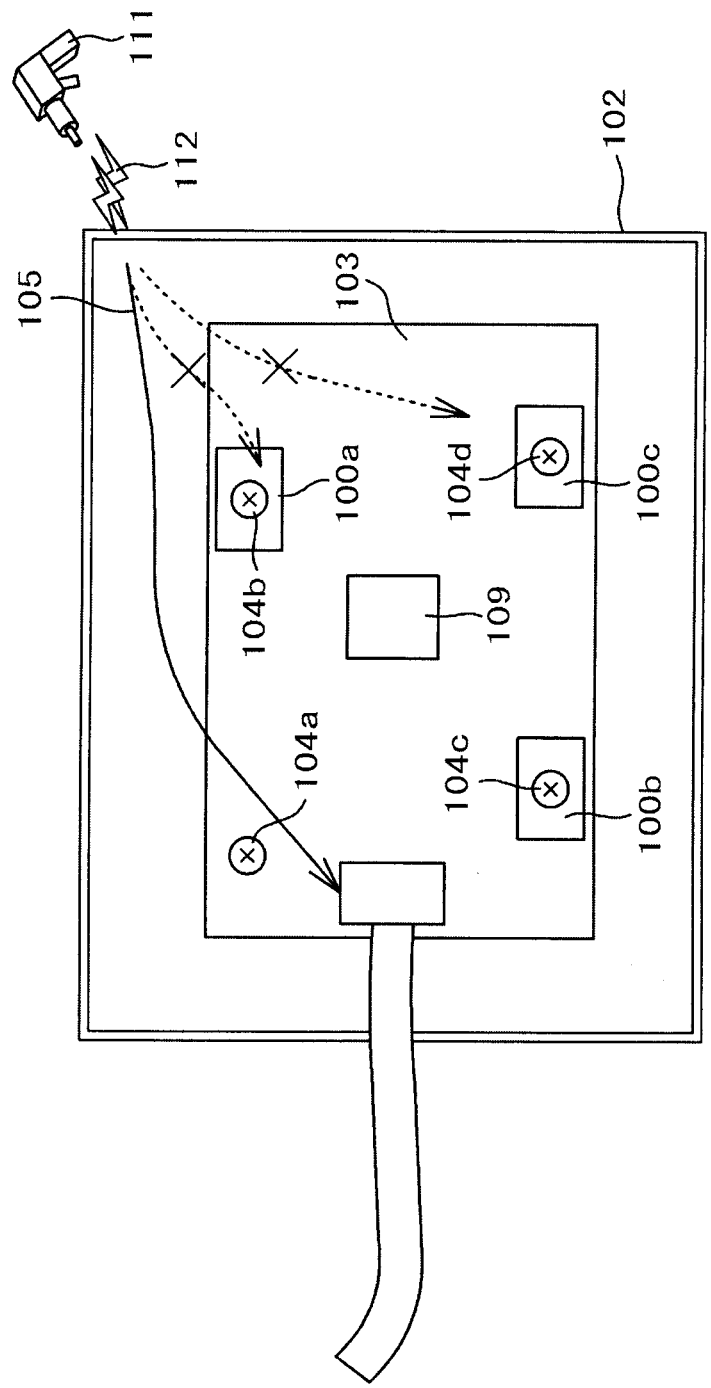
FIG. 14 is an image diagram of noise current pathway control based on how to install noise suppression components.

As shown in FIG. 14, of the portions connecting the metal enclosure 102 with the PCB or PWB 103, a portion to which the noise suppression component 100 is inserted may be selected and the value of the resistance 101 of the noise suppression component 100 may also be arbitrarily changed. The pathway of the noise current 105 flowing from the metal enclosure 102 to the PCB or PWB 103 can be thereby controlled. In FIG. 14, reference numerals 100a-100c denote noise current suppression components and 104a-104d denote screw components.

For example, if the resistance of the noise suppression component 100a or 100c is increased, noise currents indicated with arrows of dotted lines in FIG. 14 can be checked, and a noise current flowing in the direction indicated with a solid line can be increased. That is to say, the noise current flowing toward the LSI can be reduced by making the noise current flow as indicated with the arrow of the solid line in FIG. 14.

In the description of the present embodiment, the electrostatic test which is one of the immunity tests is especially referred to. It goes without saying that the present invention provides the same effect for other tests specified by IEC such as a radiation immunity test emitting electromagnetic waves or an immunity test applying pulse noise.

As described heretofore, the noise suppression component 100 of the present invention can reduce the noise current 105 flowing from the metal enclosure 102 into the PCB or PWB 103 and control noise getting mixed into the LSI 109 mounted on the PCB or PWB 103. Consequently, the malfunction of the LSI 109 is reduced and a more reliable electronic device can be provided by the present invention.

Embodiment 2

An embodiment of a noise suppression component 100 according to the present invention is described in detail with reference to FIGS. 4A to 8B. FIGS. 4A to 7B shows noise suppression components configured to have substantially the same size and shape as those of the metal washer 901. FIGS. 8A and 8B show a noise suppression component having the same configuration as that of the screw 104. Each of them can be employed by replacing them with the conventionally used metal washer 901 and screw 104.

Figure 4A:
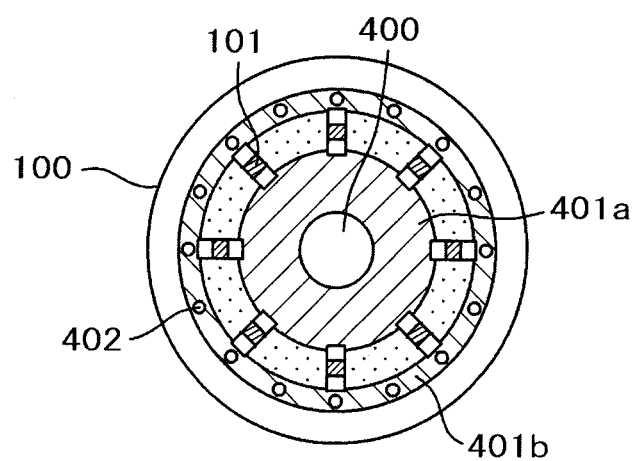
FIG. 4A is a plan view of a noise suppression component provided with eight resistors.
Figure 4B:
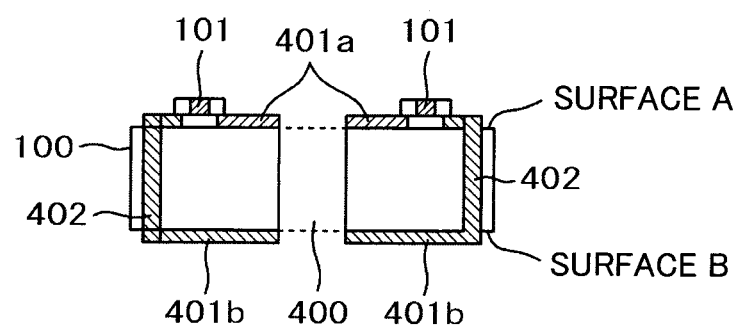
FIG. 4B is a cross-sectional view of a noise suppression component provided with eight resistors.
Figure 5A:
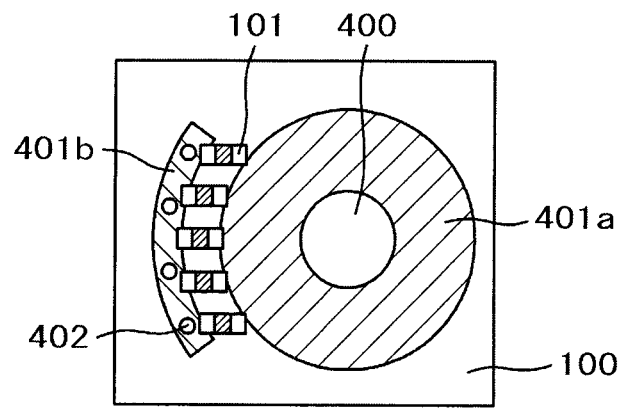
FIG. 5A is a plan view of a noise suppression component provided with five resistors.
Figure 5B:
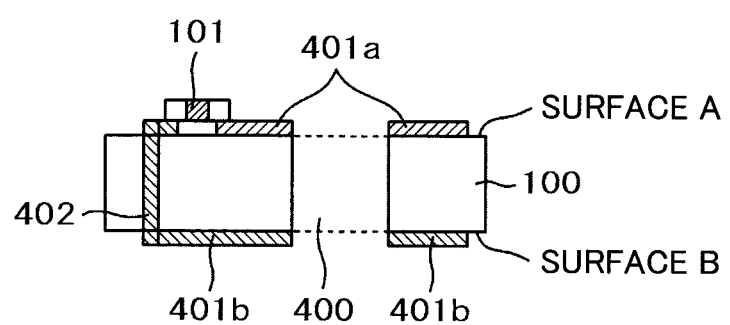
FIG. 5B is a cross-sectional view of a noise suppression component provided with five resistors.
Figure 6A:
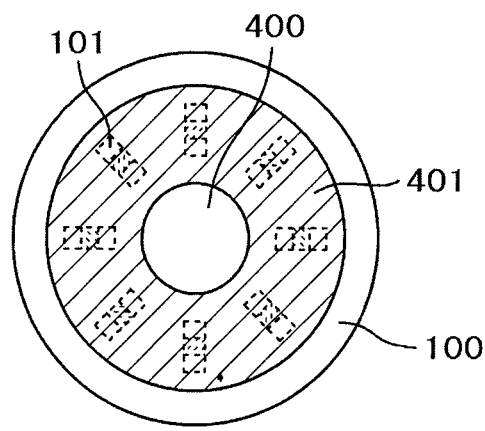
FIG. 6A is a plan view of a noise suppression component configured such that eight resistors are embedded.
Figure 6B:
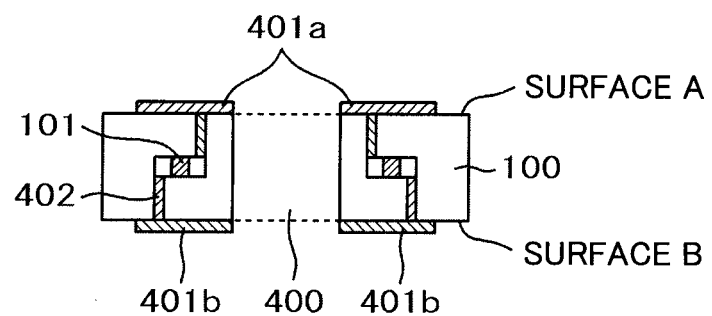
FIG. 6B is a cross-sectional view of a noise suppression component configured such that eight resistors are embedded.

Details of FIGS. 4A to 5B are first described. FIGS. 4A and 5A are plan views of the noise suppression component 100 and FIGS. 4B and 5B are cross-sectional views of the noise suppression component 100. An upper portion and a lower portion of the noise suppression component 100 are respectively defined as a surface A and a surface B in the cross-sectional views of FIGS. 4B and 5B.

The noise suppression component 100 is composed of a threaded hole 400 adapted to receive a screw therethrough, a surface-A connection pad 401a, a surface-B connection pad 401b and resistors 101. Resistors 101 mounted on the noise suppression component 100 electrically connect the surface-A connection pad 401a with the surface-B connection pad 401b at any resistance value.

The noise suppression component 100 is thereby configured to have an electric loss between the surface-A connection pad 401a and the surface-B connection pad 401b due to the resistors 101. A via 402 is used to connect the surface-B connection pad 401b of the noise suppression component 100 at the surface A and the surface B.

Inserting the noise suppression component 100 having such configuration enables arbitrary resistance to be inserted between the metal spacer 108 and the PCB or PWB 103 or between the screw 104 and the PCB or PWB 103 shown in FIGS. 1 to 3.

FIGS. 4A and 4B shows the configuration where eight of the resistors are mounted. If the resistance of the noise suppression component 100 is set as e.g. 10 ohms, eight of 80-ohm chip resistors are to be mounted. FIGS. 5A and 5B shows a configuration where five of the resistors are mounted. Similarly, if a resistance of e.g. 10 ohms is set as the resistance value of the noise suppression component 100, five of 50-ohm chip resistors should be mounted.

In FIGS. 5A and 5B, the resistors are disposed on one side of the threaded hole. Therefore, the form of the noise suppression component can be made small compared with the case where the resistors are arranged concentrically. Meanwhile, when the resistors are disposed only on one side, the flexibility of inductance controlling is limited compared with the case where the resistors are arranged concentrically.

Figure 7A:
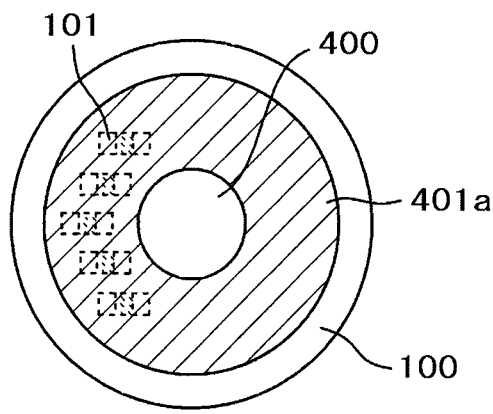
FIG. 7A is a plan view of a noise suppression component configured such that five resistors are embedded.
Figure 7B:
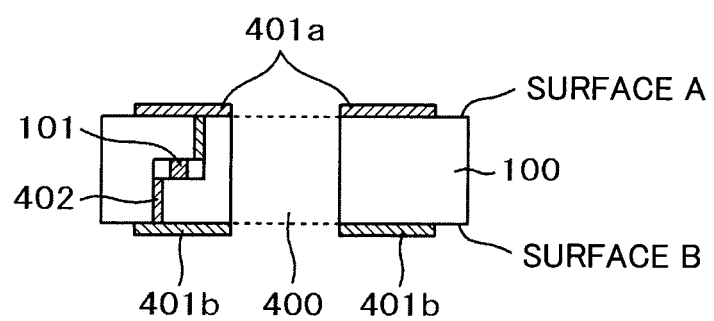
FIG. 7B is a cross-sectional view of a noise suppression component configured such that five resistors are embedded.
Figure 8A:
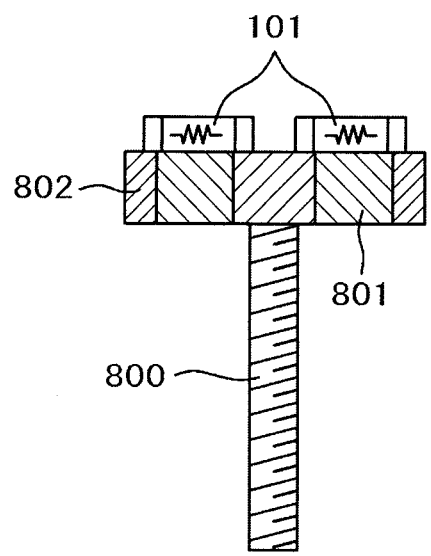
FIG. 8A is a cross-sectional view of a screw having a noise suppression structure in which resistors are arranged on a screw plate.
Figure 8B:
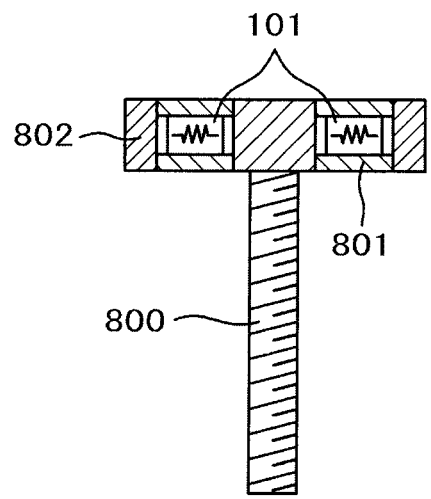
FIG. 8B is a cross-sectional view of a screw having a noise suppression structure in which resistors are arranged in a screw plate.

FIGS. 6A-7B show other embodiments of the noise suppression component 100 according to the present invention. Similarly to FIGS. 4A-5B, FIGS. 6A and 7A are plan views of the noise suppression component 100 and FIGS. 6B and 7B are cross-sectional views of the noise suppression component 100. The noise suppression components 100 shown in FIGS. 6A-7B are different from the embodiments described earlier with FIGS. 4A-5B in that resistors 101 are embedded between the surface A and surface B of the noise suppression component 100, that is, in an inner layer thereof.

In the embodiments shown in FIGS. 4A-5B, due to restriction on the height of resistors 101 mounted on the surface A of the noise suppression component 100, the noise suppression component 100 of the present invention may not be inserted into devices in which the metal spacer 108 and components are crowded. However, the configuration shown in each of FIGS. 6A, 6B and 7A, 7B has no restriction on the height of components or the resistors 101. The noise suppression components 100 shown in FIGS. 6A-7B can be inserted into such components crowded areas.

The resistance value of the noise suppression component 100 shown in each of FIGS. 6A, 6B and 7A, 7B can be set similarly to that shown in each of FIGS. 4A, 4B and 5A, 5B. While the resistors 101 shown in FIGS. 4A-5B can be mounted externally so as to arbitrary change the resistance value of the resistor 101, it is difficult to arbitrarily change the resistance value of the resistors 101 shown in FIGS. 6A-7B.

Incidentally, FIGS. 6A-7B show the configuration in which the chip resistors are embedded in the inner layer of the noise suppression component 100. A resistant material may instead be embedded in place of the chip resistors to produce the same effect.

Additionally, while the embodiments shown in FIGS. 4A-7B illustrate the noise suppression components 100 on which the eight or five resistors 101 are mounted, the same effect can be produced even if the number of resistors 101 is one or ten. In this case, if it is assumed that the number of the resistors 101 mounted on the noise suppression component 100 is N and the resistance value of the noise suppression component 100 is R ohm, a resistor 101 having a value obtained by dividing R [ohm] by N should be mounted.

FIGS. 8A and 8B are cross-sectional views illustrating further other embodiments of the noise suppression component in the present embodiment. The noise suppression components 100 shown in FIGS. 8A and 8B are noise suppression screws 800 each having a noise suppression structure. Resistors 101 are each provided between the noise suppression screw 800 and a corresponding one of conductors 802 of respective screw plates 801.

Each of the screws in FIGS. 8A and 8B has a shank portion and a plate portion. The plate portion has a basic structure including a first conductive portion connected to the shank portion, an insulating portion surrounding the first conductive portion, and a second conductive portion surrounding the insulating portion. Thus, in this state, the first conductive portion of the plate portion and the second conducting portion of the plate portion are not electrically connected to each other. In the present embodiment, a resistance member is disposed between the first conductive portion and second conductive portion of the plate portion.

FIG. 8A shows a structure in which the resistors 101 are mounted on the screw plate 801. FIG. 8B shows a structure in which the resistors 101 are embedded inside the screw plate 801. The ways for determining a resistance value and the number of the resistors 101 is the same as the contents described earlier with FIGS. 4A-7B. As with FIGS. 6A-7B, the resistors 101 embedded as shown in FIG. 8B may either be chip resistors or resistive materials and the same effect can be obtained.

Figure 9:
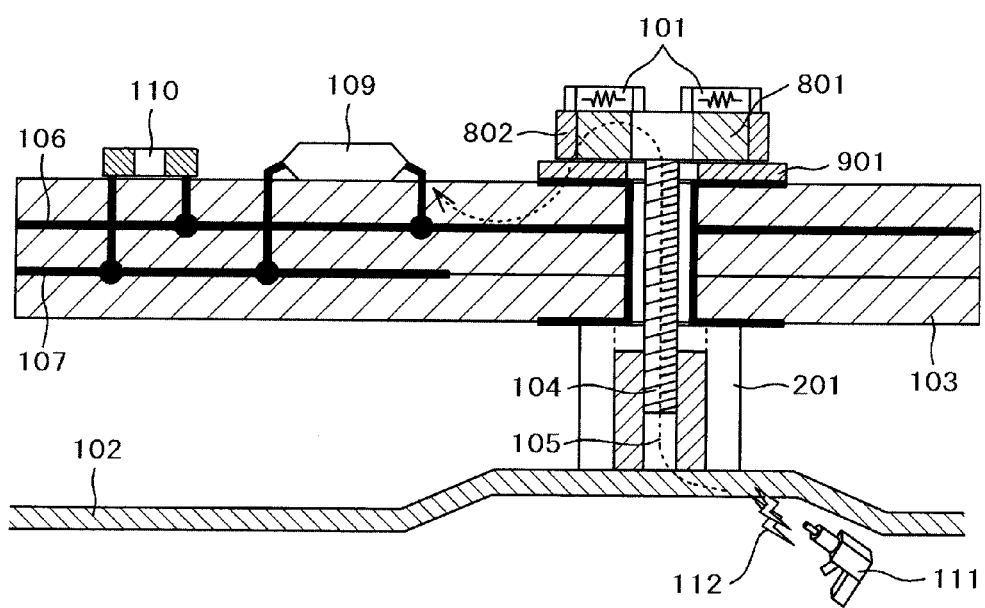
FIG. 9 is a cross-sectional view of a device on which a screw having a noise suppression structure is mounted.

FIG. 9 is a cross-sectional view showing an example in which the noise suppression screw 800 described with FIG. 8 is applied to an actual device. If the metal-embedded plastic spacer 201 as described with FIG. 2 is used, a noise current flowing into the PCB or PWB 103 via the embedded metal and the screw 104 can be suppressed.

In FIG. 2, the noise suppression component 100 is inserted in place of the metal washer 901. Meanwhile, in the embodiment shown in FIG. 9, the metal screw 104 is replaced with the noise suppression screw 800 to secure the PCB or PWB 103 to the enclosure 102 and the metal-embedded plastic spacer 201, thereby suppressing the noise current 105.

Although the configuration in FIG. 9 uses the spacer having metal therein as a spacer, the present embodiment is not limited to this configuration. For example, a metal spacer may be used as the spacer. In this case, it is predicted that resistance on the metal spacer side is reduced. Metal spacers or the like may be used in cases where the current on the screw plate side on the PCB or PWB is more intended to be controlled or suppressed than the noise current on the metal spacer side on the PCB or PWB.

The description has been given thus far focusing on the control of the noise current 105 flowing into the PCB or PWB 103 from the metal enclosure 102 during the electrostatic test with reference to FIGS. 1-9. However, it goes without saying that the noise suppression component 100 proposed by the present invention has the same effect for the noise current 105 reversely flowing into the metal enclosure 102 from the LSI 109 via the ground trace 106 in the PCB or PWB 103, the screw 104 and the metal spacer 108.

Embodiment 3

Embodiment 3 describes a probe for noise measurement and a measuring method of the measurement. The washer-type noise suppression components 100 shown in FIGS. 4A-7B can be utilized as noise measurement probes by modifying the configurations thereof. The use of the noise measurement probe makes it possible to measure the noise current 105 flowing into the PCB or PWB 103 from the metal enclosure 102 via the metal spacer 108 and the screw 104.

Figure 10A:
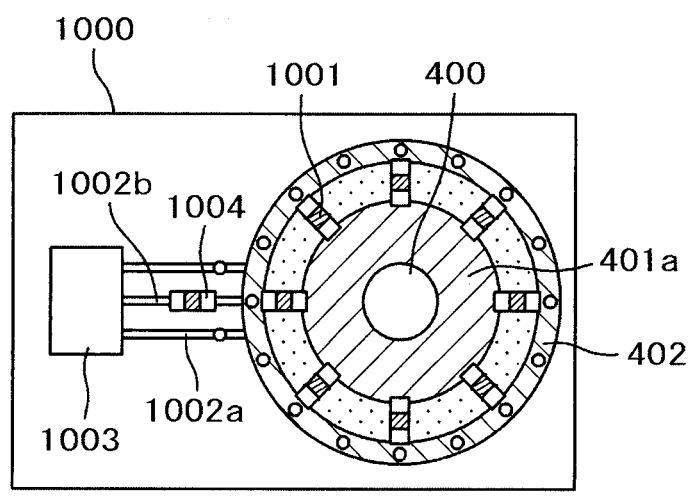
FIG. 10A is a plan view of a resistance detection screw current probe.
Figure 10B:
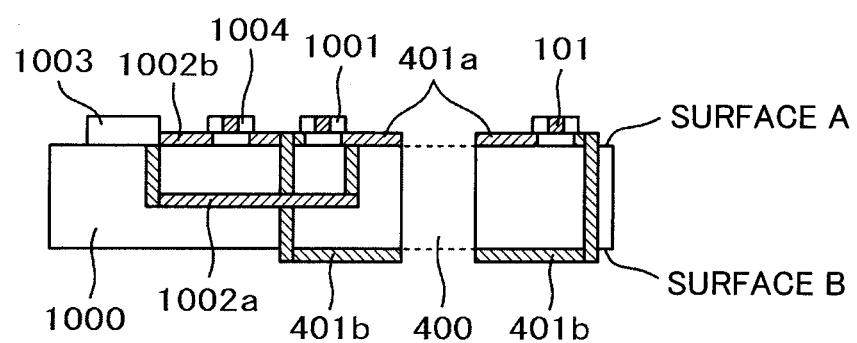
FIG. 10B is a cross-sectional view of a resistance detection screw current probe.

One example of the embodiment of the probe structure for measuring an electric current flowing into a joint portion between the metal enclosure 102 and the PCB or PWB 103 is described by use of FIGS. 10A and 10B. FIG. 10A is a plan view of a resistance detection screw current probe 1000 and FIG. 10B is a cross-sectional view of the resistance detection screw current probe 1000.

The resistance detection screw current probe 1000 shown in FIGS. 10A and 10B is provided by modifying and transforming the noise suppression component 100 shown in FIGS. 4A and 4B. The resistance detection screw current probe 1000 includes a threaded hole 400, a surface-A connection pad 401a, a surface-B connection pad 401b, a detection resistor 1001, a surface-A connection pad extension line 1002a, a surface-B connection pad extension line 1002b, a voltage detection terminal 1003 and a matching resistor 1004.

Figure 11:
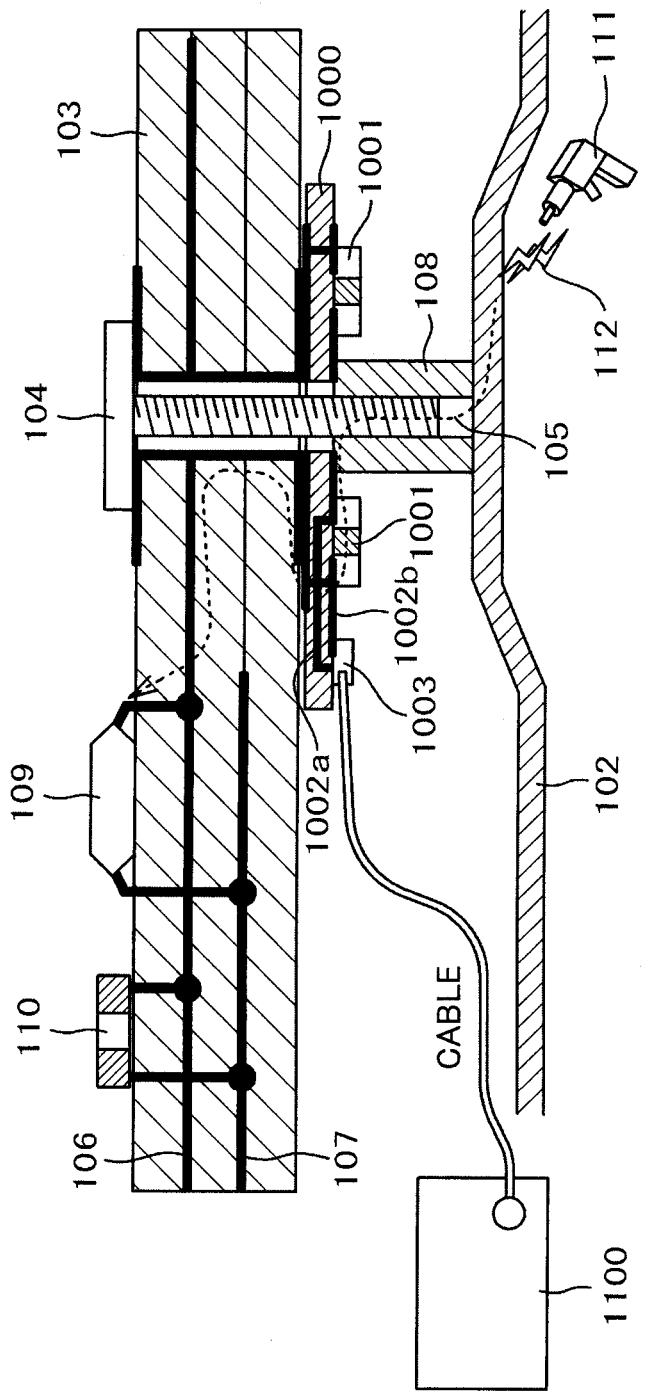
FIG. 11 is a cross-sectional view of when a noise current flowing between a metal enclosure and a PCB or PWB is measured.

FIG. 11 shows a state where the resistance detection screw current probe 1000 is used to measure a noise current 105 flowing between the metal enclosure 102 and the PCB or PWB 103 during an electrostatic test. As shown in FIG. 11, when the electrostatic noise 112 is applied to the metal enclosure 102 by the ESD gun 111, the noise current 105 flows from the metal enclosure 102 and the metal spacer 108 to the PCB or PWB 103 via the resistance detection screw current probe 1000.

The noise current 105 flows into the detection resistor 1001, so that a voltage difference occurs between the surface-A connection pad 401a side and surface-B connection pad 401b side of the detection resistor 1001. This voltage difference is observed by a measuring instrument 1100 such as an oscilloscope, a spectrum analyzer or the like via the surface-A connection pad extension line 1002a and the surface-B connection pad extension line 1002b. The noise current 105 can be thus measured. Similarly to the explanation for the resistance value of the noise suppression component 100 in FIG. 4A, 4B, if the resistance value of the resistance detection screw current probe 100 is 10 ohms, eight of the chip resistors of 80 ohms should be mounted as detection resistors 1001.

Figure 12:
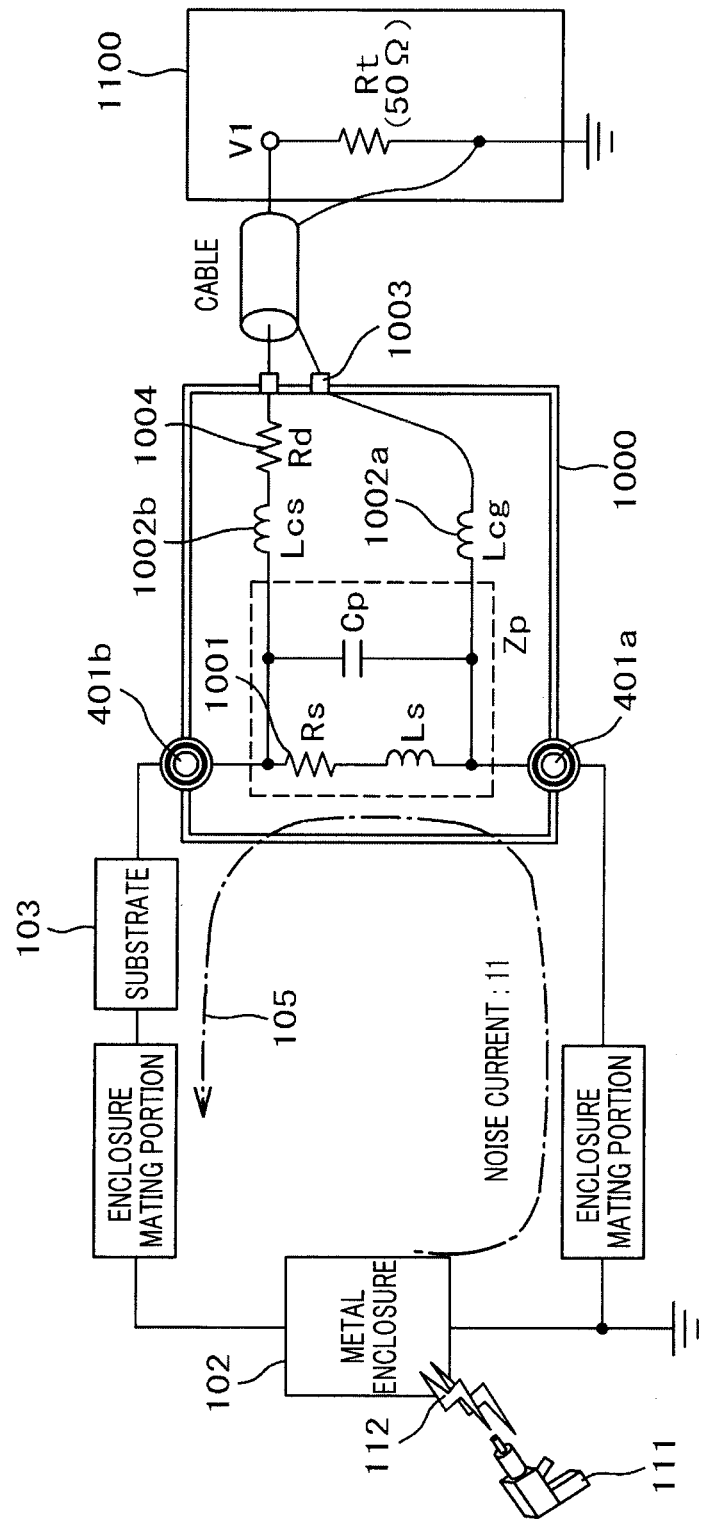
FIG. 12 is a block diagram of noise current measurement using a resistance detection screw current probe.

A detailed description is here given of the measurement principle of the noise current 105 using the resistance detection screw current probe 1000 shown in FIG. 11. FIG. 12 is a block diagram in which the metal enclosure 102 and the PCB or PWB 103 are blocked and the resistance detection screw current probe is drawn in further detail. As can be seen from the figure, the resistance detection screw current probe 1000 is inserted between the metal enclosure 102 and the PCB or PWB 103 via enclosure mating portions: metal spacer 108, the screw 104 or the like in FIG. 11. The resistance detection screw current probe 1000 is connected from the voltage detection terminal 1003 via a cable to the measuring instrument 1100 and terminates at Rt=50 ohms.

A detailed explanation of the resistance detection screw current probe 1000 depicted in a circuit diagram of FIG. 12 is next complemented. The detection resistor 1001 or a current detecting portion is assumed to have a resistance Rs, parasitic inductance is assumed to be Ls and parasitic capacitance is assumed to be Cp, and these are collectively defined as impedance Zp of a detecting portion. Further, the surface-A connection pad extension line 1002a is assumed to be Lcg, the surface-B connection pad extension line 1002b is assumed to be Lcs, a matching resistor 1004 is assumed to be Rd and voltage to be detected by the measuring instrument 1100 is assumed to be V1.

In FIG. 12, if the noise current 105 flowing when the electrostatic noise 112 is applied to the metal enclosure 102 by the ESD gun 111 is assumed to be I1, the voltage V1 detected by the measuring device 1100 is represented as (expression 1).

[Expression 1]

$$V_1 = \frac{R_t \cdot Z_p \cdot I_1}{Z_p + j\omega(L_{cs} + L_{cg}) + R_d + R_t} \quad (1)$$

$Z_p$ is the impedance of the detecting portion and is represented as (expression 2).

[Expression 2]

$$Z_p = \frac{R_s + j\omega L_s}{1 + j\omega \cdot C_p(R_s + j\omega L_s)} \quad (2)$$

Symbol ω is an angular frequency and is represented as (expression 3).

[Expression 3]

$$\omega = 2\pi \cdot f \quad (3)$$

Figure 13:
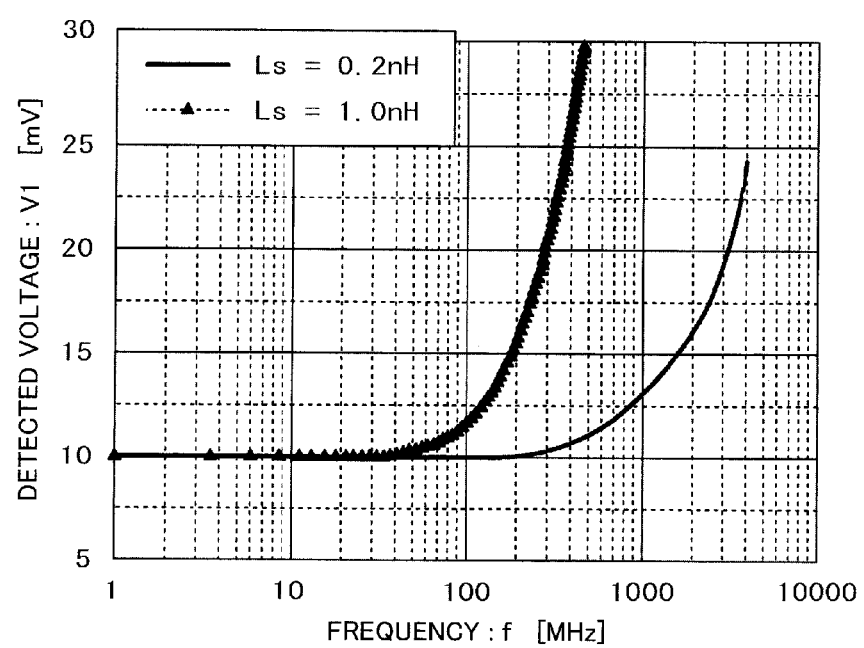
FIG. 13 is a graph of detected voltage and frequency characteristics of the resistance detection screw current probe.

In FIG. 12, when the noise current 105 flows at a constant amplitude of 10 mA in a frequency range of 1 MHz to 4 GHz, calculation results of the voltage V1 detected by the measuring instrument 1100 are illustrated as FIG. 13. These results are obtained under the following conditions: Rs is set at 1 ohm and Rd is set at 0 ohm; Lcs and Lcg are both set at 3 nH, and Cp is fixed at 3 pF; and Ls is set at 0.2 nH and at 1.0 nH.

In the example of a measurement of the resistance detection screw current probe 1000 shown in FIG. 13, the voltage V1 detected by the measuring instrument 1100 is constantly 10 mV at a frequency of 500 MHz or below. At a frequency of 500 MHz or higher, the voltage V1 tends to increase with the frequency. This largely relates to the property of impedance Zp of the detecting portion represented in (expression 2). That is, when ω=0 (f=0) is substituted in (expression 1) and (expression 2), Zp=Rs holds, and the detected voltage V1 is represented by a constant product of the noise current 105: I1 and the detected resistance 101: Rs. A point of variation at which the V1 is the constant product of I1 and Rs is determined by a cutoff frequency: fc of the impedance Zp of the detecting portion. The cutoff frequency is represented by (expression 4).

[Expression 4]

$$f_c = \frac{R_s}{2\pi \cdot L_s} \quad (4)$$

Accordingly, the value of the noise current 105 may be considered to be obtained by dividing the detected voltage V1 by Rs at a cut off frequency fc or below. However, this is established when the matching resistor 104: Rd=0 ohm holds. When the matching resistor 1004: R4 and the detection resistor 1001: Rs are in a relation of R4+Rs=50, the value of the noise current 105: I1 can be obtained by doubling the detected voltage V1 and dividing the doubled value by the detection resistor 1001: Rs.

In the resistance detection screw current probe 1000, the conversion from the detected voltage to current is very easy at a frequency such that is a constant product of the noise current 105: I1 and the detection resistor 1001: Rs. Therefore, the resistance detection screw current probe 1000 has better property as the cutoff frequency is higher.

According to the present invention described above, the cutoff frequency can be controlled easily by appropriately selecting Ls. In other words, a flat area in FIG. 13 can arbitrarily be varied. Further, according to the present invention, the flat area in FIG. 13 can be broadened easily. According to an experiment, the flat area in FIG. 13 can be broadened to approximately 4 GHz.

FIG. 10 shows the embodiment in which the eight detection resistors 1001 are mounted on the resistance detection screw current probe 1000. However, the number of the detection resistors 1001 mounted may be five as shown in the noise suppression component 100 of FIG. 5 and the same effect can be produced. Further, needless to say, also a structure similarly to those shown in FIGS. 6 and 7 where the detection resistors 1001 are embedded between the A-surface connection portion 401a and the B-surface connection surface 401b, i.e., in the inner layer can produce the same effect. Further, as with the structure in FIG. 8, the detection resistors 1001 may be mounted on or embedded in the screw plate 801 and voltage between both the ends of the detection resistor 1001 may be measured to obtain the noise current 105 flowing via the screw.

Even when the number of the detection resistors 1001 is one or ten, the same effect can be produced. When a number of N detection resistors 1001 are mounted on a resistance detection screw current probe of which resistance value is to be R ohm, the value of the N detection resistors 101 can be obtained by dividing R [ohm] by N [pieces].

However in the resistance detection screw current probe 1000, the inductance of the detected portion is smaller and the cutoff frequency represented by expression 4 is higher when a plurality of (e.g., five, eight or more) detection resistors 1001 are mounted than that of when one resistor 1001 is mounted. Thus, the resistance detection prove 1000 has satisfactory property. The reason for this is as below.

For example, it is assumed that a chip having a size of 1.0 mm×0.5 mm or 0.4 mm×0.2 mm is used for the resistance detection resistor 1001. The parasitic inductance of the chip resistor of this size is approximately 1 nH. If the number of the detection resistors 1001 is one, Ls in FIG. 13 is 1 nH. On the other hand, if the number of the detection resistors 1001 is five, the parasitic inductance is one-fifth, i.e., Ls=0.2 nH in FIG. 13. When the parasitic inductance Ls is able to be reduced by embedding a resistant material as shown in FIGS. 6 and 7, it is not necessary to arrange a plurality of the detection resistors.

Description for the embodiments of the resistance detection screw current probe 1000 according to the present invention has been made by taking as an example the electrostatic test using the discharged gun 111 as shown in FIG. 11. However, the resistance detection screw current probe 1000 of the present invention has the same effect for other immunity tests such as, for example, a radiation immunity test, a conductive pulse test or the like.

The description is given focusing on the measurement of the noise current 105 flowing into the PCB or PWB 103 from the metal enclosure 102 with reference to FIG. 11. It goes without saying that the present invention can be applied to the measurement of the noise current 105 reversely flowing from the LSI 109 via the ground trace 106 of the PCB or PWB 103, the screw 104 and the metal spacer 108 into the metal enclosure 102, producing the same effect. The probe 1000 can be utilized as a probe for identifying a source or a problematic portion of EMI.

Figure 15:
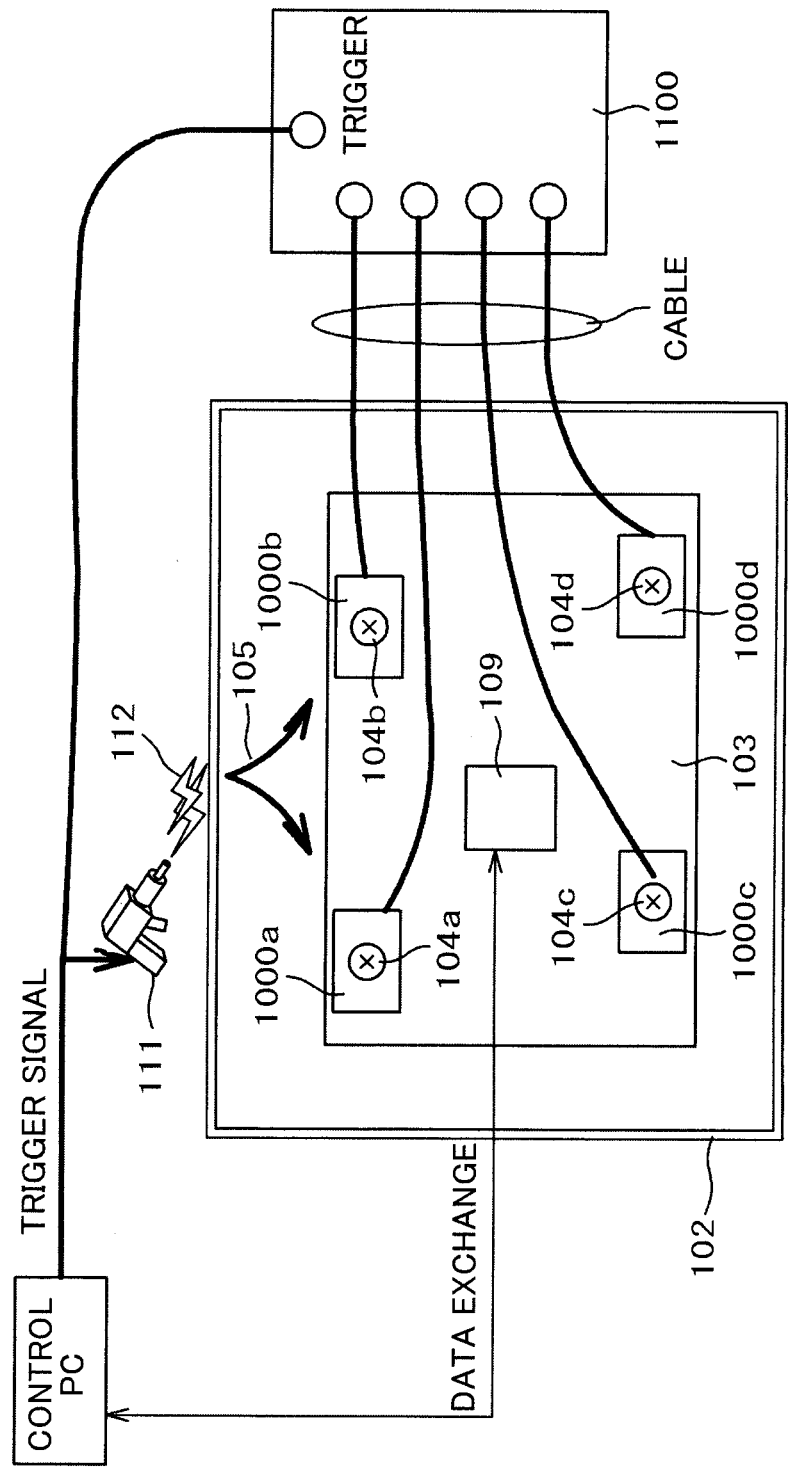
FIG. 15 is an image diagram of measurement using a plurality of the resistance detection screw current probes.

Next, a description is given of a method of measuring a current flowing in joint portions between the metal enclosure 102 and the PCB or PWB 103 of the electronic device during an electrostatic test by use of a plurality of the resistance detection screw current probe. FIG. 15 shows one example of such a method. Resistance detection screw current probes 1000a-d are secured by corresponding screws 104a-d at four joint portions between the metal enclosure 102 and the PCB or PWB 103. Further, respective cables are pulled out from the resistance detection screw current probes 1000a-d and connected to a measuring instrument 1100.

An ESD gun 111 is connected to a control PC. The control PC controls the discharge of electrostatic noise. Control signals of the ESD gun 111 are inputted into the control PC as triggers of the measuring instrument 1100. The control PC is also connected to the LSI 109 to control the LSI 109 and to monitor the inside of the LSI 109 during the test.

In FIG. 15, the control PC emits a trigger signal and the ESD gun 111 applies electrostatic noise 112 to each of the screws 104a-d. At this time, the noise current 105 flowing in each of the screws 104-d is observed by the measuring instrument 1100.

The control PC monitors the inside of the LSI 109 during the application of the electrostatic noise 112. A position where the electrical discharge causes the malfunction of the LSI 109 can be determined. In addition, it is also possible to analyze which one of the screws 104a-d that the noise current 105 acting as an obstacle flows through at that time. Thus, the noise current measuring method and measuring system can be provided such that is capable of elucidating the mechanism of the LSI 109 malfunctions during the electrostatic test, and in turn, elucidating the mechanism of the electronic device malfunctions.

EXPLANATION OF REFERENCE NUMERALS

100 . . . noise suppression component, 101 . . . resistor, 102 . . . metal enclosure, 103 . . . PCB or PWB, 104 . . . screw, 105 . . . noise current, 106 . . . ground trace, 107 . . . power trace, 108 . . . metal spacer, 109 . . . LSI, 110 . . . bypass capacitor, 111 . . . ESD gun, 112 . . . electrostatic noise, 201 . . . metal-embedded plastic spacer, 400 . . . threaded hole, 401a . . . surface-A connection pad, 401b . . . surface-B connection pad, 402 . . . via, 800 . . . noise suppression screw, 801 . . . screw plate, 802 . . . conductor, 901 . . . metal washer, 1000 . . . resistance detection screw current probe, 1001 . . . detection resistor, 1002a . . . surface-A connection pad extension line, 1002b . . . surface-B connection pad extension line, 1003 . . . voltage detection terminal, 1004 . . . matching resistor, 1100 . . . measuring instrument.

The invention claimed is:

1. An electronic device in which an enclosure and a PCB or PWB with a circuit component mounted thereon are secured by a screw and a metal spacer:
   wherein a noise suppression component of which base material is an insulating material is disposed between the PCB or PWB and the metal spacer; and
   a first conducting portion is formed on the metal spacer side of the noise suppression component, a second conducting portion is formed on the PCB or PWB side of the noise suppression component, and a resistance member is disposed between the first conducting portion and the second conducting portion.

2. The electronic device according to claim 1:
   wherein the resistance member is disposed on a first surface of the noise suppression component.

3. The electronic device according to claim 1:
   wherein the resistance member is embedded in the inside of the noise suppression component.

4. The electronic device according to claim 1:
   wherein a plurality of the resistance members are formed parallel to each other.

5. An electronic device in which an enclosure and a PCB or PWB with a circuit component mounted thereon are secured by a screw having a plate portion and a shank portion and a metal spacer:
   wherein the plate portion of the screw includes a first conductive portion connected to the shank portion, an insulator portion surrounding the first conductive portion, and a second conductive portion surrounding the insulator portion and electrically connected to the PCB or PWB; and
   a resistance member is disposed between the first conductive portion and the second conductive portion.

6. The electronic device according to claim 5:
   wherein the resistance member is disposed on a surface of the insulator portion.

7. The electronic device according to claim 5:
   wherein the resistance member is embedded in the inside of the insulator portion.

8. The electronic device according to claim 5:
   wherein a plurality of the resistance members are formed.

9. A method of measuring a noise current in an electronic device:
   wherein the electronic device has a configuration such that an enclosure and a PCB or PWB with a circuit component mounted thereon are secured by a screw and a metal spacer;
   a noise suppression component of which base material is an insulating material is disposed between the PCB or PWB and the metal spacer;
   a first conducting portion is formed on the metal spacer-side of the noise suppression component, a second conducting portion is formed on the PCB or PWB-side of the noise suppression component and a resistance member is disposed between the first conducting portion and the second conducting portion; and voltage between two ends of the resistance member is measured via a matching resistor connected in series with the resistance member.

* * * * *